(12) United States Patent
Schwarz et al.

(10) Patent No.: US 8,912,689 B2
(45) Date of Patent: Dec. 16, 2014

(54) ELECTRONIC SWITCH CONTROL SYSTEM AND ELECTRONIC SWITCH DRIVE METHOD

(75) Inventors: Marcos Guilherme Schwarz, Joinville (BR); Nerian Fernando Ferreira, Joinville (BR)

(73) Assignee: Whirlpool S.A., Sao Paulo (BR)

( * ) Notice: Subject to any disclaimer, the term of this patent is extended or adjusted under 35 U.S.C. 154(b) by 669 days.

(21) Appl. No.: 13/264,754

(22) PCT Filed: Apr. 16, 2010

(86) PCT No.: PCT/BR2010/000129
§ 371 (c)(1),
(2), (4) Date: Dec. 8, 2011

(87) PCT Pub. No.: WO2010/118495
PCT Pub. Date: Oct. 21, 2010

(65) Prior Publication Data
US 2012/0074776 A1 Mar. 29, 2012

(30) Foreign Application Priority Data
Apr. 16, 2009 (BR) .................................. PI0900948

(51) Int. Cl.
*H03K 5/1536* (2006.01)
*H03K 19/003* (2006.01)
*H03K 17/13* (2006.01)

(52) U.S. Cl.
CPC ........ *H03K 5/1536* (2013.01); *H03K 19/00376* (2013.01); *H03K 17/136* (2013.01)
USPC ............................................. 307/130; 307/18

(58) Field of Classification Search
CPC .................................. H03K 5/1536; H02J 3/00

USPC ....................................................... 307/18, 130
See application file for complete search history.

(56) References Cited

U.S. PATENT DOCUMENTS

| 4,274,045 | A | * | 6/1981 | Goldstein | ..................... | 323/319 |
| 4,336,464 | A | * | 6/1982 | Weber | ........................ | 307/141.4 |

(Continued)

FOREIGN PATENT DOCUMENTS

WO     WO 01/059930     8/2001

OTHER PUBLICATIONS

International Search Report mailed Mar. 31, 2011 for International application No. PCT/BR2010/000129.

(Continued)

*Primary Examiner* — Rexford Barnie
*Assistant Examiner* — Joseph Inge
(74) *Attorney, Agent, or Firm* — Fay Sharpe LLP

(57) ABSTRACT

An electronic switch control system, including an alternating voltage source, an electronic switch, a load, a control circuit, an alternating voltage source being electrically associated to a first conduction terminal of the electronic switch, a second conduction terminal of the electronic switch being associable to a load, the load being associated to a second power terminal. The control circuit includes first, second and third electric potential terminals, and is arranged to command the electronic switch by way of a trigger terminal. The control circuit is electrically associated to a voltage regulator block that is electrically associable to the electronic switch by way of first and third electric contact terminals and first and second conduction terminals respectively, the voltage regulator block being arranged to provide a minimum electrical voltage ($V_{min}$) to run the control circuit in at least a conduction instant of the electronic switch.

11 Claims, 2 Drawing Sheets

(56) References Cited

U.S. PATENT DOCUMENTS

| | | | |
|---|---|---|---|
| 4,878,010 A * | 10/1989 | Weber | 323/300 |
| 5,365,162 A * | 11/1994 | Sundhar | 323/320 |
| 6,396,724 B1 * | 5/2002 | Hirst | 363/125 |
| 2002/0000797 A1 * | 1/2002 | Schultz et al. | 323/282 |
| 2005/0162140 A1 * | 7/2005 | Hirst | 323/273 |

OTHER PUBLICATIONS

Written Opinion mailed Mar. 31, 2011 for International application No. PCT/BR2010/000129.

* cited by examiner

ELECTRONIC SWITCH CONTROL SYSTEM AND ELECTRONIC SWITCH DRIVE METHOD

The present invention refers to an electronic switch control system for general use, capable of driving various types of loads, being immune to noise and interference from the mains supply, besides being formed based on a control circuit electrically coupled to said switch. The control circuit is connected to a voltage regulator block designed to power said circuit in at least a conduction instant of the present switch.

The present invention also refers to an electronic switch drive method designed to control it in accordance with the teachings of the present invention.

DESCRIPTION OF THE STATE OF THE ART

Known devices for controlling alternating currents supplied to a certain load, and that are capable of performing a function autonomously, typically comprise relay type electro-mechanical devices, or TRIAC type solid state switches.

Said devices can be associated to an electronic command circuit which often needs a power source with sufficient current capacity to activate said switch or electro-mechanical device.

Said power source is normally connected to the voltage itself of the mains supply, in order to provide the necessary current, over time, for the electronic command circuit, in the conduction and jamming moments of said switch, such that the same current is sufficient for the electronic command circuit remains operative.

Yet oftentimes the aforementioned power source has to be sized to provide a relatively high current, from the thousandth to the hundredth fraction of current unit, presenting an arrangement in which its terminals are connected directly to the two terminals of the alternating current mains supply.

This type of connection makes the power source use components sized to provide the high current level cited above, besides exposing said source to the voltage originating from the mains and to all the interference and voltage spikes typical of domestic power lines, also requiring suitable sizing and the use of protection components to avoid damage to this circuit. Said solution renders this device more expensive and complex.

Some prior arts seek to offer an electronic switch capable of controlling certain loads. The North American patent U.S. Pat. No. 4,878,010 reveals an electronic switch and a command circuit powered by the residual voltage present in said switch. The arrangement proposed in the document above, besides providing an electronic arrangement having a high number of components, has a substantially more expensive circuit compared to the present invention.

Additionally, said document U.S. Pat. No. 4,878,010 does not refer to the use of an efficient system and electronic switch control method that is capable of eliminating noise and any interference from the mains supply, such as that proposed in the present invention, described in detail ahead.

Another example of the state of the art refers to the arrangement described in patent U.S. Pat. No. 4,274,045, whose solution for controlling an electronic switch also presents technical and economic drawbacks when compared to the present invention.

The North American document U.S. Pat. No. 6,396,724 describes a continuous voltage source. Said source is capable of supplying a minimum electrical voltage to run any electronic circuit, when the latter requires low operating power. Patent U.S. Pat. No. 6,396,724 does not reveal, in turn, an application specially designed to power a control circuit applied to driving an electronic switch, such as proposed in the present invention.

The North American patent application US 2005/0162140 presents an electronic switch, or switching circuit, designed to control loads in an alternating current, such as an inductive charge.

In any case, it is noted that the subject matter disclosed in application US 2005/0162140 does not offer a particularly beneficial electronic switch drive system, in terms of immunity to noise and interference from the mains, in accordance with the teachings of the present invention.

Based on that set forth above, the present system and electronic switch control method offers the most efficient and robust control for said switch, when compared to prior arts, in addition to making use of a reduced number of components for implementing said system.

OBJECTIVES OF THE INVENTION

A first objective of the present invention is to propose an electronic switch drive system for general use, capable of driving various types of loads, providing immunity to noise and interference from the mains supply, besides being formed based on a control circuit electrically coupled to said switch, the latter further connected to a voltage regulator block designed to power the control circuit in at least a conduction instant of the electronic switch.

It is also an objective of the present invention to propose an electronic switch drive method designed to control it in at least a conducting state of said switch, in accordance with the teachings of the present invention.

BRIEF DESCRIPTION OF THE INVENTION

One way of achieving the objective of the present invention is by means of an electronic switch control system, comprising at least one alternating voltage source, at least one electronic switch, at least a load, at least one control circuit, the alternating voltage source being electrically associated, by way of a first power terminal, to a first conduction terminal of the electronic switch, a second conduction terminal of the electronic switch being associable to the load, by way of a first load terminal, a load being associated to a second power terminal, by way of a second load terminal, the control circuit comprising first, second and third electric potential terminals, the control circuit being arranged to command the electronic switch by way of a trigger terminal, the control circuit being electrically associated to a voltage regulator block, the voltage regulator block having first, second and third electric contact terminals, the control circuit being electrically associable to the voltage regulator block by way of second and third electric potential terminals and second and third electric contact terminals respectively, the voltage regulator block being electrically associable to the electronic switch by way of the first and third electric contact terminals and of the first and second conduction terminals respectively, the voltage regulator block being arranged to provide a minimum electrical voltage to run the control circuit in at least a conduction instant of the electronic switch.

A second way of achieving the objectives of the present invention is by providing an electronic switch drive method, comprising an electronic switch, one alternating voltage source, a load, a control circuit and a voltage regulator block, said method comprising the following steps:

measure, by way of the control circuit, an operating voltage between a second conduction terminal of the electronic switch and a trigger terminal of the electronic switch;

determine, based on the measured operating voltage, whether there is a current circulating through the load in a first time instant, for a positive semicycle of the power voltage supplied by the alternating voltage source;

determine, based on the measured operating voltage, whether there is a current circulating through the load in a third time instant, for a negative semicycle of the power voltage supplied by the alternating voltage source;

if a certain current is substantially near to zero value, for a positive semicycle of the power voltage supplied by the alternating voltage source, count a delay time calculated from the first time instant up to a second time instant;

if a certain current is substantially near to zero value, for a negative semicycle of the power voltage supplied by the alternating voltage source, count a delay time calculated from the third time instant up to a fourth time instant;

supply an electric trigger pulse in the trigger terminal of the electronic switch at the end of counting the delay time;

after the electric trigger pulse, provide a minimum electrical voltage, by way of the voltage regulator block, to power the control circuit when the electronic switch is off, both in the positive semicycle, and in the negative semicycle of the power voltage.

BRIEF DESCRIPTION OF THE DRAWINGS

The present invention will now be described in greater detail, with reference to the appended drawings, wherein.

DETAILED DESCRIPTION OF THE DRAWINGS

Figure 1:
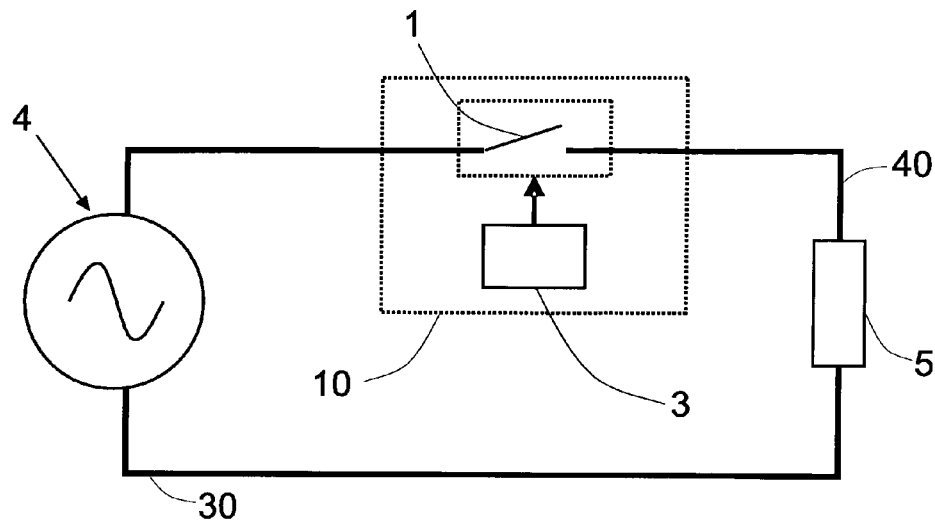
FIG. 1—represents a first schematic view of the electronic switch control system, object of the present invention.

FIG. 1 illustrates a general electrical diagram of the electronic switch 1, belonging to the control system that is the object of the present invention.

More particularly, the present system comprises at least one alternating voltage source 4, at least one electronic switch 1, at least a load 5 and at least one control circuit 3. The control circuit 3 is preferably comprised of a digital processor of the microcontroller kind, or by a digital signals processor (DSP) specially designed for the purpose of the present invention.

Said alternating voltage source 4 is electrically associated, by way of a first power terminal 20, to a first conduction terminal 25 of the electronic switch 1.

Figure 2:
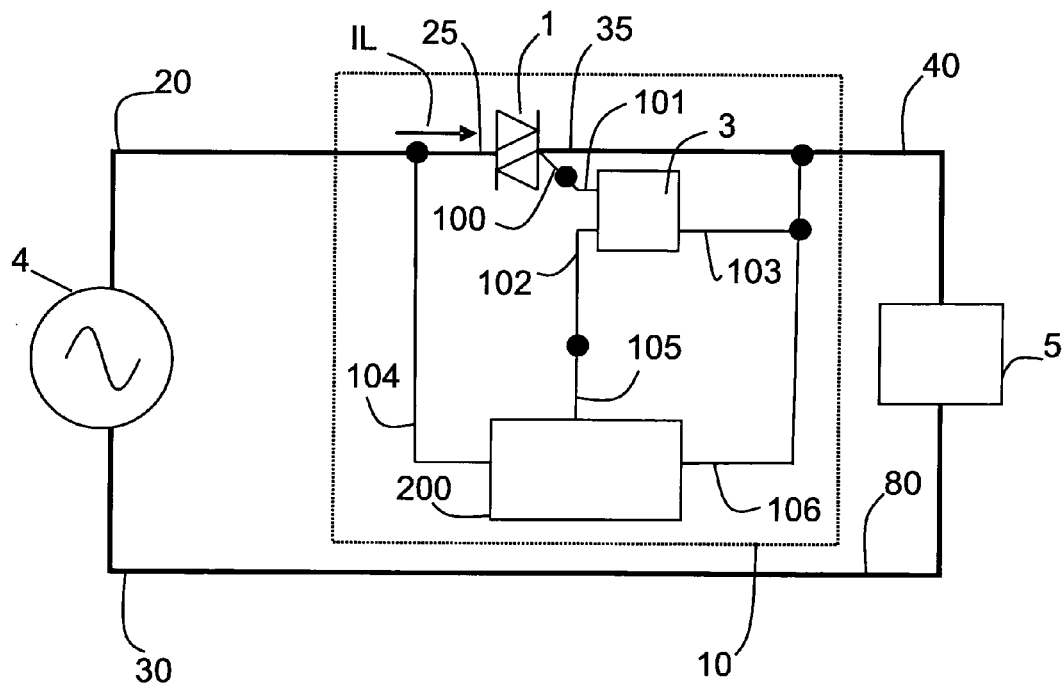
FIG. 2—represents a second schematic view of the electronic switch control system highlighting certain functional blocks, in accordance with the teachings of the present invention.

Said electronic switch 1 may be comprised of a thyristor type device, such as a TRIAC, or the like. The same electronic switch 1 has a second conduction terminal 35, this being electrically associable to the load 5, by way of a first load terminal 40. FIG. 2 shows a schematic view of the control system now proposed, highlighting some of its functional blocks.

Figure 3:
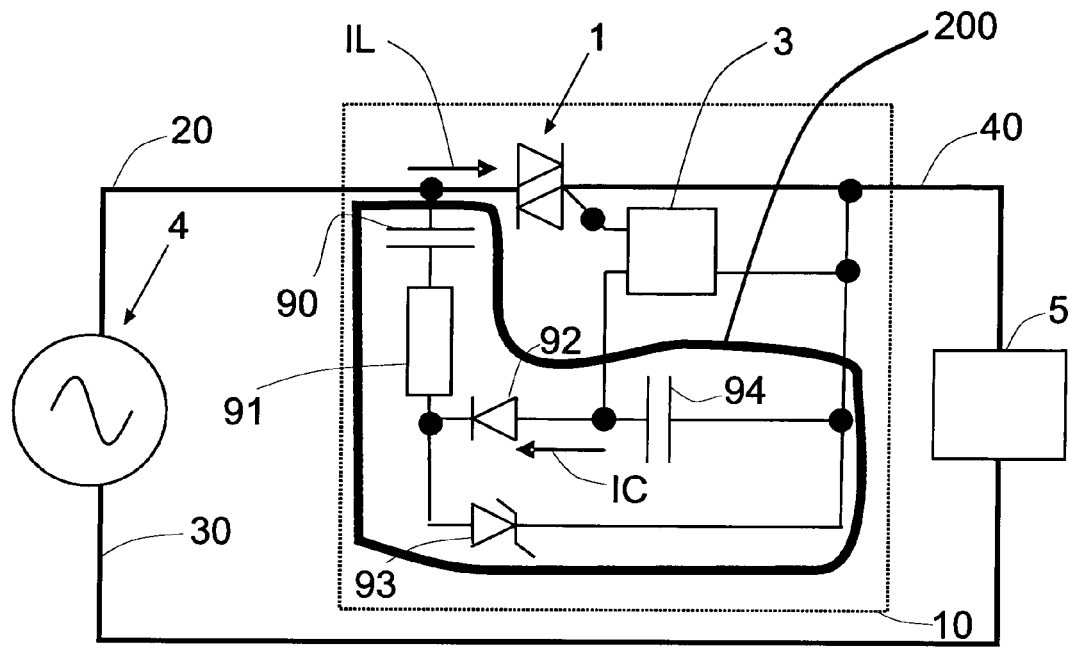
FIG. 3—represents a third schematic view of the electronic switch control system, highlighting the components of the voltage regulator block, in a preferred embodiment, in accordance with the teachings of the present invention.

FIG. 3, in turn, is a detailed illustration of a preferred embodiment for the present invention.

In the same figure, it is noted that the load 5 is associable to a second power terminal 30, by way of a second load terminal 80.

Additionally, it is noted in FIG. 3. that the control circuit 3 comprises first, second and third electric potential terminals 101,102,103, said control circuit 3 being arranged to command the electronic switch 1 by way of a trigger terminal 100.

The control circuit 3 commands an electric current conduction by way of the electronic switch 1 by way of electric trigger pulses in the trigger terminal 100.

An important characteristic of the present system refers to the use of a voltage regulator block 200, electrically associated to the control circuit 3.

As shown in FIG. 3, the voltage regulator block 200 has first, second and third electric contact terminals 104,105,106.

Preferably, it is further possible to observe that the control circuit 3 is electrically associable to the voltage regulator block 200 by way of second 102 and third 103 electric potential terminals 102,103, and second and third electric contact terminals 105,106 respectively.

An innovative characteristic of the present invention refers to the fact that the voltage regulator block 200 is electrically associable to the electronic switch 1, by way of the first and third electric contact terminals 104,106 and of the first and second conduction terminals 25,35 respectively.

In other words, it can be said that the voltage regulator block 200 is electrically associated, and in parallel, to the electronic switch 1, as illustrated in FIG. 2.

Said arrangement, as mentioned previously, prevents said voltage regulator block 200 from being subject to potential transients and noise from the mains supply.

It is emphasized that normally a person skilled in the art would make a similar connection to said block 200, simply by connecting the terminals of said block directly to the phase and neutral terminals of the mains, which represents, in the present application, connecting said block 200 to the first and second power terminals 20,30.

It is important to emphasize that the voltage regulator block 200 now proposed is arranged to provide a minimum electrical voltage $V_{min}$, to run the control circuit 3, in at least one conduction instant of the electronic switch 1.

Additionally, the voltage regulator block 200, in accordance with the teachings of the present invention, is arranged to provide a minimum electrical voltage $V_{min}$ to run the control circuit 3 in an instant of jamming of the electronic switch 1.

As can be noted in FIG. 3, the third electric potential terminal 103 is electrically associated to the first load terminal 40 of the load 5.

Moreover, the voltage regulator block 200 is electrically associated to the first power terminal 20 of the alternating voltage source 4 by way of the first electric contact terminal 104.

An additional characteristic of the present invention refers to the fact that the minimum electrical voltage $V_{min}$ is provided, based on a preferred embodiment, by way of an electric charge transfer between at least two capacitive elements 90,94 disposed in the voltage regulator block 200. Said capacitive elements 90,94 are characterized by capacitors from the market, which can be formed by various types of dielectrics.

Said arrangement confers greater simplicity to said block 200, providing a reduced number of components, and facilitating potential maintenance of the equipment, besides reducing the costs for the end product.

As already mentioned, the control circuit 3 is electrically associated to the voltage regulator block 200, the latter being electrically associated, and in parallel, to the electronic switch 1.

Preferably, FIG. 3 illustrates an embodiment of electronic circuit for the voltage regulator block 200. The same FIG. 2 shows that the first capacitive element 90 is electrically associated and in series with an electric current limiting element 91.

Said electric current limiting element 91 can be comprised of a resistor, an inductor, or by a combination thereof. The limiting element 91 is responsible for limiting the pulse current level that is established when the electronic switch 1 begins conduction, thus guaranteeing the integrity and durability of the components of said regulator block 200.

FIG. 3 also shows that the electric current limiting element 91, is electrically associated to a semiconductor current element 92 and to a voltage regulating element 93, in accordance with a preferred embodiment of the voltage regulator block 200, object of the present invention.

The semiconductor current elements 92 and voltage regulator 93 are, preferably, diode and diode Zener devices respectively. The voltage regulating element 93 guarantees that the voltage on the second capacitive element 94 never exceeds a maximum permitted value for the safe running of the control circuit 3.

From FIG. 3 it is possible to note that the first capacitive element 90 has one of its terminals connected to the first power terminal 20, whereas its second terminal is linked to a terminal of the electric current limiting element 91.

The second terminal of the current limiting element 91 is electrically associated to the cathode of the semiconductor current element 92 and to the anode of the voltage regulating element 93.

Additionally, it is noted in FIG. 3 that the semiconductor current element 92 is electrically associated to the second capacitive element 94, from its terminal anode.

Moreover, it is noted that the voltage regulating element 93 is electrically associated to the semiconductor current element 92, from its anode, and to the second capacitive element 94, from its cathode terminal.

In other words, it can also be affirmed that the region or general block 10 revealed by FIGS. 1 to 3, from the dotted line, schematically confers an arrangement in which the electronic switch 1, preferably of the TRIAC type, has one of its anodes connected to the first power terminal 20 which supplies energy originating from the alternating voltage source 4, the latter having its other anode connected to the first load terminal 40 which supplies energy to the load 5. Said electronic switch 1 has its trigger terminal 100 connected to the first electric potential terminal 101 of the control circuit 3.

Further according to FIG. 3, and as already mentioned, the first capacitive element 90 has one of its terminals connected to the first power terminal 20 and its second terminal connected to a terminal of the electric current limiting element 91. Additionally, it is noted that said limiting element 91 has its other terminal connected to the cathode of the semiconductor current element 92, the latter preferably being a diode, and to the anode of the voltage regulating element 93 of the Zener type, and the semiconductor current element 92 has its anode connected to the first electric potential terminal 101 of the control circuit 3.

The voltage regulating element 93 has its cathode connected to the first load terminal 40 which supplies energy to the load 5.

Still according to FIG. 3, the first electric potential terminal 101 of the control circuit 3, connected to the anode of the semiconductor current element 92, is connected to the second capacitive element 94, which has its other terminal connected to the first load terminal 40, which supplies energy to the load 5. The control circuit 3 has the second electric potential terminal 102 connected to the first load terminal 40.

As mentioned previously, and based on the embodiment described above, the voltage regulator block 200 now proposed is arranged to provide a minimum electrical voltage $V_{min}$ for the control circuit 3 by way of an electric charge transfer between the first and second capacitive elements 90,94.

The present invention also provides an electronic switch drive method, comprising one electronic switch 1, one alternating voltage source 4, a load 5, one control circuit 3 and one voltage regulator block 200.

Figure 4:
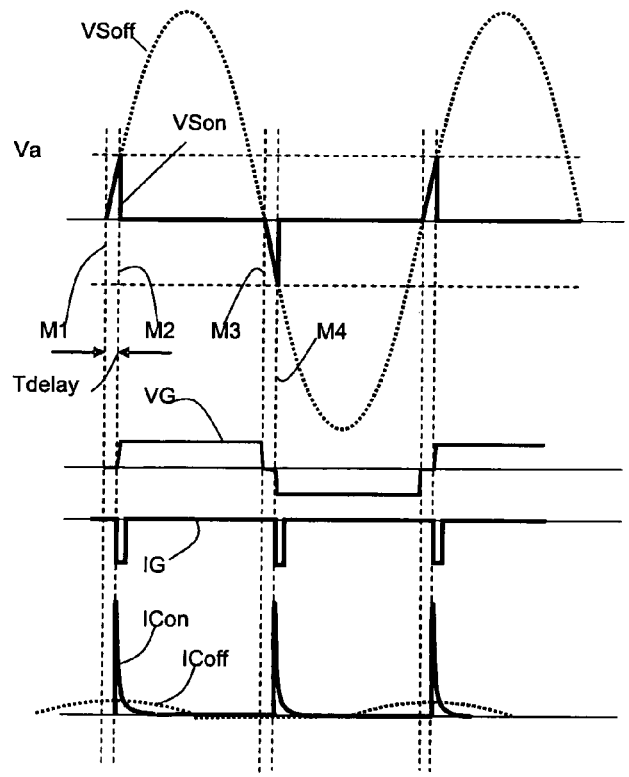
FIG. 4—represents a schematic view of the electrical signals characteristic of the operation of the present system, object of the present invention.

FIG. 4 shows the magnitudes involved throughout the application of the present method for controlling said electronic switch 1.

It is known that the switch voltage $V_{Son}$, existing between the first and second conduction terminals 25,35, is given by the sum of the rise in voltage supplied by the alternating voltage source 4, with the voltage existing on the load 5, accumulating up to the moment in which the electronic switch 1 begins conduction.

At the instant of conduction of the switch 1, the voltage on the first and second conduction terminals 25,35 suddenly falls to a value near zero.

Said electronic switch 1 begins conduction by consequence of an electric trigger pulse $I_G$ applied in the trigger terminal 100.

Said electric trigger pulse $I_G$ is supplied to the trigger terminal 100 after a delay time $T_{delay}$, which should be sufficient so that the voltage on the second capacitive element 94 is sufficient to maintain the normal running of the control circuit 3.

This situation occurs when a current $I_c$ supplied by the second capacitive element 94 is sufficient to power said control circuit 3. It must be pointed out that in this condition, the voltage on the first and second conduction terminals 25,35 of the electronic switch 1 will be equal or greater than a minimum electrical voltage $V_{min}$.

Typically, said minimum electric voltage $V_{min}$ is about 3V, whereas the maximum electric voltage is about 5V.

Based on the above, and as illustrated in FIG. 4, in a second time instant $M_2$, when the electronic switch 1 is triggered, and the switch voltage $V_{Son}$ falls to a value near zero, the first capacitive element 90, which presents between its terminals a voltage substantially equal to that which was observed between the first and second conduction terminals 25,35, of the electronic switch 1, transfers its load to the second capacitive element 94, by way of a Icon current pulse, maintaining an average voltage level in this second capacitive element 94 sufficient to run the control circuit 3.

As mentioned previously, the limiting element 91 is responsible for limiting the pulse current level which is established when the electronic switch 1 begins conduction, since said pulse current circulating by way of the second capacitive element 94 is raised based on the reduced time in which the electronic switch 1 begins conduction.

During the complementary semicycle, the first capacitive element 90 again charges itself with a minimum electric voltage $V_{min}$, again assuming the necessary state to provide another ICon pulse current to the second capacitive element 94, as soon as the electronic switch 1 is triggered in the following semicycle.

Accordingly, in each semicycle the process of transferring the load between the first and second capacitive elements 90,94 occurs, maintaining on the terminals of the second capacitive element 94 a sufficient voltage to keep the control circuit 3 running.

It is also important to point out that a capacitance of the second capacitive element 94 should be sufficient to maintain a minimum electrical voltage $V_{min}$ needed during a full cycle of the mains frequency, which will essentially depend on the current level drained by the control circuit 3.

In the condition when the electronic switch 1 is on, without command pulses being supplied, the current consumption of the control circuit 3 is significantly reduced, the latter being necessary only to execute certain autonomous functions. Also in this condition, maintaining the voltage on the second capacitive element 94 is given by a second ICoff pulse current, circulating over the first capacitive element 90 and resulting from the voltage variation imposed by the alternating voltage source 4. Said second ICoff pulse current is normally significantly reduced.

Additionally, the present method provides for the execution of the following steps:
  measure, by way of the control circuit 3, an operating voltage $V_{op}$ between the second conduction terminal 35 of the electronic switch 1 and a trigger terminal 100 of the electronic switch 1;
  determine, based on the measured operating voltage $V_{op}$, whether there is a current $I_c$ circulating through the load 5 in a first time instant $M_1$, for a positive semicycle of the power voltage supplied by the alternating voltage source 4;
  determine, based on the measured operating voltage $V_{op}$, whether there is a current $I_c$ circulating through the load 5 in a third time instant $M_3$, for a negative semicycle of the power voltage supplied by the alternating voltage source 4;
  if a certain current $I_c$ is substantially near to zero value, for a positive semicycle of the power voltage supplied by the alternating voltage source 4, count a delay time $T_{delay}$ calculated from the first time instant $M_1$ up to a second time instant $M_2$;
  if a certain current is substantially near to zero value, for a negative semicycle of the power voltage supplied by the alternating voltage source 4, count a delay time $T_{delay}$ calculated from the third time instant $M_3$ up to a fourth time instant $M_4$;
  supply an electric trigger pulse $I_G$ in the trigger terminal 100 of the electronic switch 1 at the end of counting the delay time $T_{delay}$;
  after the electric trigger pulse $I_G$, provide a minimum electrical voltage $V_{min}$, by way of the voltage regulator block 200, to power the control circuit 3 when the electronic switch 1 is off, both in the positive semicycle, and in the negative semicycle of the power voltage.

In view of the above description, the invention object now proposed provides a control system for an efficient and robust electronic switch, compared to the prior arts referred to previously, also having a reduced number of components, as well as method for driving said electronic switch 1, particularly efficient in terms of driving various types of loads.

Lastly, the present invention provides an electronic switch control system capable of executing a large variety of functions, such as: timing for turning the load 5 on or off, such as in a lighting system, for example, the response to a temperature signal (thermostat), observed by a sensor incorporated into said control circuit 3, and also the possibility of response to any other signal captured by the control circuit 3, such as an infrared signal received by the same circuit.

In this sense, the present system will cause an alteration in the conducting state of the electronic switch 1, when the function implemented in said control circuit 3 assumes the desired state set up by the user.

Having described an example of a preferred embodiment, it should be understood that the scope of the present invention encompasses other possible variations, being limited only by the content of the appended claims, potential equivalents included therein.

The invention claimed is:

1. An electronic switch control system (10), comprising:
  at least one alternating voltage source (4),
  at least one electronic switch (1),
  at least a load (5),
  at least one control circuit (3),
  the alternating voltage source (4) being electrically associated, by way of a first power terminal (20), to a first conduction terminal (25) of the electronic switch (1),
  the second conduction terminal (35) of the electronic switch (1) being associable to the load (5), by way of a first load terminal (40),
  the load (5) being associated to a second power terminal (30), by way of a second load terminal (80),
  the control circuit (3) comprising first, second and third electric potential terminals (101,102,103),
  the control circuit (3) being arranged to command the electronic switch (1) by way of a trigger terminal (100), wherein the control circuit (3) is electrically associated to a voltage regulator block (200),
  the voltage regulator block (200) having first, second and third electric contact terminals (104,105,106),
  the control circuit (3) being electrically associable to the voltage regulator block (200) by way of second and third electric potential terminals (102,103) and second and third electric contact terminals (105,106) respectively,
  the voltage regulator block (200) being electrically associable to the electronic switch (1) by way of the first and third electric contact terminals (104,106) and the first and second conduction terminals (25,35) respectively,
  the voltage regulator block (200) being arranged to provide a minimum electrical voltage ($V_{min}$) to run the control circuit (3) in at least one conduction instant of the electronic switch (1).

2. The electronic switch control system (10), according to claim 1, wherein the voltage regulator block (200) is arranged to provide a minimum electrical voltage ($V_{min}$) to run the control circuit (3) in one instant of jamming of the electronic switch (1).

3. The electronic switch control system (10), according to claim 1, wherein the third electric potential terminal (103) is electrically associated to the first load terminal (40) of the load (5).

4. The electronic switch control system (10), according to claim 2, wherein the voltage regulator block (200) is electrically associated to the first power terminal (20) of the alternating voltage source (4) by way of the first electric contact terminal (104).

5. The electronic switch control system (10), according to claim 1, wherein a minimum electrical voltage ($V_{min}$) is provided by way of an electric charge transfer between at least two capacitive elements (90,94) disposed in the voltage regulator block (200).

6. The electronic switch control system (10), according to claim 1, wherein the voltage regulator block (200) is electrically associated, and in parallel, to the electronic switch (1).

7. The electronic switch control system (10), according to claim 1, wherein the control circuit (3) commands an electric current conduction by way of the electronic switch (1) by way of electric trigger pulses.

8. An electronic switch control system (10), comprising:
at least one alternating voltage source (4),
at least one electronic switch (1),
at least a load (5),
at least one control circuit (3),
the alternating voltage source (4) being electrically associated, by way of a first power terminal (20), to a first conduction terminal (25) of the electronic switch (1),
the second conduction terminal (35) of the electronic switch (1) being associable to the load (5), by way of a first load terminal (40),
the load (5) being associated to a second power terminal (30), by way of a second load terminal (80),
the control circuit (3) comprising first, second and third electric potential terminals (101,102,103), the control circuit (3) being arranged to command the electronic switch (1) by way of a trigger terminal (100), wherein:
the control circuit (3) is electrically associated to a voltage regulator block (200), the voltage regulator block (200) having first, second and third electric contact terminals (104,105,106), the control circuit (3) being electrically associable to the voltage regulator block (200) by way of second and third electric potential terminals (102,103) and second and third electric contact terminals (105, 106) respectively, the voltage regulator block (200) is electrically associated, and in parallel, to the electronic switch (1).

9. An electronic switch control system (10), comprising:
at least one alternating voltage source (4),
at least one electronic switch (1),
at least a load (5),
at least one control circuit (3),
the alternating voltage source (4) being electrically associated, by way of a first power terminal (20), to a first conduction terminal (25) of the electronic switch (1), a second conduction terminal (35) of the electronic switch (1) being associable to the load (5), by way of a first load terminal (40), a load (5) being associated to a second power terminal (30), by way of a second load terminal (80), the control circuit (3) comprising first, second and third electric potential terminals (101,102,103), the control circuit (3) being arranged to command the electronic switch (1) by way of a trigger terminal (100), wherein the control circuit (3) is electrically associated to a voltage regulator block (200), the voltage regulator block (200) being electrically associated, and in parallel, to the electronic switch (1), the voltage regulator block (200) having first and second capacitive elements (90,94), the first capacitive element (90) being electrically associated and in series with an electric current limiting element (91), the electric current limiting element (91) being electrically associated to a semiconductor current element (92) and to a voltage regulating element (93), the semiconductor current element (92) being electrically associated to the second capacitive element (94), the voltage regulating element (93) being electrically associated to the semiconductor current element (92) and to the second capacitive element (94), the voltage regulator block (200) being arranged to provide a minimum electrical voltage ($V_{min}$) to the control circuit (3) by way of an electric charge transfer between the first and second capacitive elements (90,94).

10. An electronic switch drive method comprising the following steps:
measuring, by way of an control circuit 3, an operating voltage ($V_{op}$) between a second conduction terminal (35) of an electronic switch (1) and a trigger terminal (100) of the electronic switch (1);
determining, based on the measured operating voltage ($V_{op}$), whether there is a current ($I_c$) circulating through a load (5) in a first time instant ($M_1$), for a positive semicycle of the power voltage supplied by an alternating voltage source (4);
determining, based on the measured operating voltage ($V_{op}$), whether there is a current ($I_c$) circulating through the load (5) in a third time instant ($M_3$), for a negative semicycle of the power voltage supplied by the alternating voltage source (4);
if the current ($I_c$) is substantially near to zero value, for a positive semicycle of the power voltage supplied by the alternating voltage source (4), count a delay time ($T_{delay}$) calculated from the first time instant (Mi) up to a second time instant ($M_2$);
if the current ($I_c$) is substantially near to zero value, for a negative semicycle of the power voltage supplied by the alternating voltage source (4), count a delay time ($T_{delay}$) calculated from the third time instant ($M_3$) up to a fourth time instant ($M_4$),
supplying an electric trigger pulse ($I_G$) in the trigger terminal (100) of the electronic switch (1) at the end of counting the delay time ($T_{delay}$);
after the electric trigger pulse ($I_G$), provide a minimum electrical voltage ($V_{min}$), by way of the voltage regulator block (200), to power the control circuit (3) when the electronic switch (1) is off, both in the positive semicycle, and in the negative semicycle of the power voltage.

11. The electronic switch drive method, according to claim 10, wherein a minimum electrical voltage ($V_{min}$) is provided by way of an electric charge transfer between at least two capacitive elements (90,94) disposed in the voltage regulator block (200).

* * * * *